United States Patent
Kimura

(10) Patent No.: US 10,559,508 B2
(45) Date of Patent: Feb. 11, 2020

(54) METHOD FOR MANUFACTURING SIC SUBSTRATE

(71) Applicant: Mitsubishi Electric Corporation, Tokyo (JP)

(72) Inventor: Yasuhiro Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/208,772

(22) Filed: Dec. 4, 2018

(65) Prior Publication Data

US 2019/0355629 A1 Nov. 21, 2019

(30) Foreign Application Priority Data

May 21, 2018 (JP) .................. 2018-097208

(51) Int. Cl.
| | |
|---|---|
| H01L 21/66 | (2006.01) |
| H01L 21/306 | (2006.01) |
| H01L 21/02 | (2006.01) |
| H01L 29/16 | (2006.01) |

(52) U.S. Cl.
CPC ........ *H01L 22/26* (2013.01); *H01L 21/02378* (2013.01); *H01L 21/30625* (2013.01); *H01L 22/12* (2013.01); *H01L 29/1608* (2013.01)

(58) Field of Classification Search
CPC ..................................................... H01L 21/66
See application file for complete search history.

(56) References Cited

U.S. PATENT DOCUMENTS

| | | |
|---|---|---|
| 2015/0084065 A1 | 3/2015 | Koike et al. |
| 2015/0303050 A1 | 10/2015 | Sasaki et al. |

FOREIGN PATENT DOCUMENTS

| | | |
|---|---|---|
| WO | 2008/078666 A1 | 7/2008 |
| WO | 2013/161049 A1 | 10/2013 |
| WO | 2014/091929 A1 | 6/2014 |

*Primary Examiner* — Marvin Payen
(74) *Attorney, Agent, or Firm* — Studebaker & Brackett PC

(57) ABSTRACT

A method for manufacturing an SiC substrate includes: performing a CMP treatment on an SiC substrate; after the CMP treatment, capturing an image of a surface of the SiC substrate to detect a scratch; determining the SiC substrate as a good article when a length L of the scratch having a contrast value equal to or larger than a threshold value is not more than $\pi(D/2)^2/A \times F/100$, wherein the scratch having the contrast value equal to or larger than the threshold value in the image serves as a starting point of an epitaxial defect, a diameter of the SiC substrate is represented by D, a length of a long side of a device chip to be formed on the SiC substrate is represented by A, and an allowable defective rate caused by scratches is represented by F.

4 Claims, 5 Drawing Sheets

METHOD FOR MANUFACTURING SIC SUBSTRATE

BACKGROUND OF THE INVENTION

Field

The present invention relates to a method for manufacturing a silicon carbide (hereinafter referred to as SIC) substrate.

BACKGROUND

SiC is one of materials expected as next generation power semiconductor materials. In general, the surface of an SIC substrate is subjected to chemical mechanical polishing (hereinafter referred to as CMP treatment) before epitaxial growth. At this time, scratches may occur on the substrate surface due to abrasive grains. A method of reducing scratches has been proposed (see International Publication No, WO2014/091929, for example). However, it is impossible to completely prevent scratches due to an unforeseen factor in actual production. When there is a scratch, an epitaxial defect such as a triangular defect or a carrot defect may occur under epitaxial growth while starting from the scratch serving as a starting point. For this reason, a maximum standard for the lengths of scratches is set for SiC substrates before epitaxial growth.

SUMMARY

It has been impossible in a conventional SiC substrate manufacturing method to extract only harmful scratches serving as starting points of epitaxial defects. Therefore, there have been cases where SiC substrates having less harmful scratches are determined as defective articles, so that the yield is reduced. On the other hand, when the detection sensitivity of scratches is lowered to increase the yield, SiC substrates having many harmful scratches may be determined as good articles, so that device failure occurs.

The present invention has been made to solve the problems as described above, and an object of the present invention is to provide an SiC substrate manufacturing method which can prevent reduction of the yield and device failure, A method for manufacturing an SiC substrate according to the present invention includes: performing a CMP treatment on an SiC substrate; after the CMP treatment, capturing an image of a surface of the SiC substrate to detect a scratch; determining the SiC substrate as a good article when a length L of the scratch having a contrast value equal to or larger than a threshold value is not more than $\pi(D/2)^2/A \times F/100$, wherein the scratch having the contrast value equal to or larger than the threshold value in the image serves as a starting point of an epitaxial defect, a diameter of the SiC substrate is represented by D, a length of a long side of a device chip to be formed on the SiC substrate is represented by A, and an allowable defective rate caused by scratches is represented by F.

The inventor has found that a scratch having a high contrast value in the image of the surface of the SiC substrate serves as a starting point of an epitaxial defect. Therefore, extraction of scratches having high contrast values makes it possible to extract only harmful scratches serving as starting points of epitaxial defects. Accordingly, it is possible to prevent to determine SIC substrates having no problem as defective articles and thus prevent the yield from being reduced. Furthermore, device failure can be prevented by providing a maximum standard of the lengths of harmful scratches.

Other and further objects, features and advantages of the invention will appear more fully from the following description.

DESCRIPTION OF EMBODIMENTS

A method for manufacturing an SiC substrate according to the embodiments of the present invention will be described with reference to the drawings. The same components will be denoted by the same symbols, and the repeated description thereof may be omitted.

First Embodiment

Figure 1:
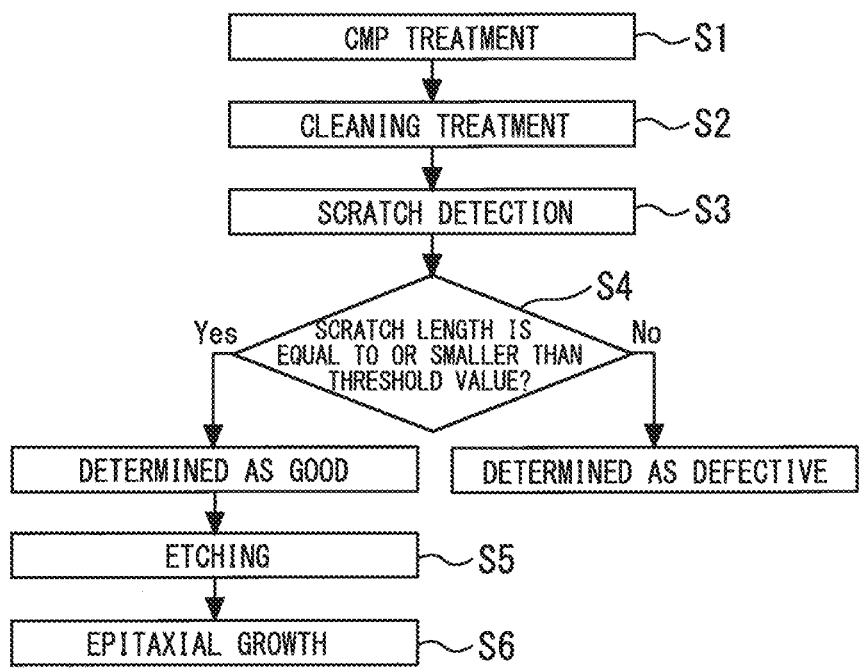
FIG. 1 is a flowchart showing an SiC substrate manufacturing method according to a first embodiment.
Figure 2:
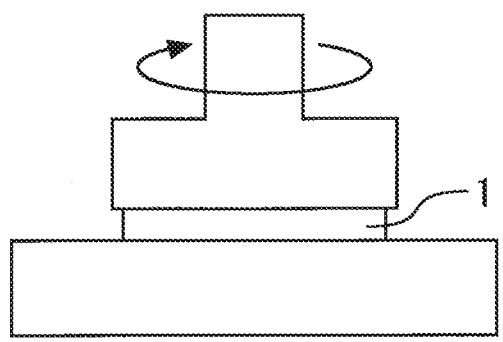
FIGS. 2 to 4 are cross-sectional views showing the SiC substrate manufacturing method according to the first embodiment.
Figure 3:
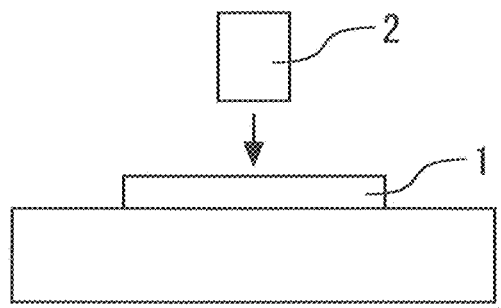
Figure 4:
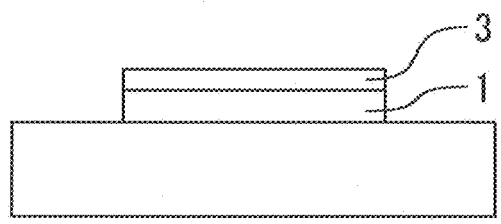

FIG. 1 is a flowchart showing an SIC substrate manufacturing method according to a first embodiment. FIGS. 2 to 4 are cross-sectional views showing the SIC substrate manufacturing method according to the first embodiment. First, an SiC single crystal manufactured by a sublimation method or the like is processed into a substrate state to form an SIC substrate 1. Next, the CMP treatment is performed on the SiC substrate 1 (step S1) as shown in FIG. 2. Next, a cleaning treatment is performed (step S2). Next, as shown in FIG. 3, an image of the surface of the SiC substrate 1 is captured by a detector 2 to detect a scratch (step S3).

Figure 5:
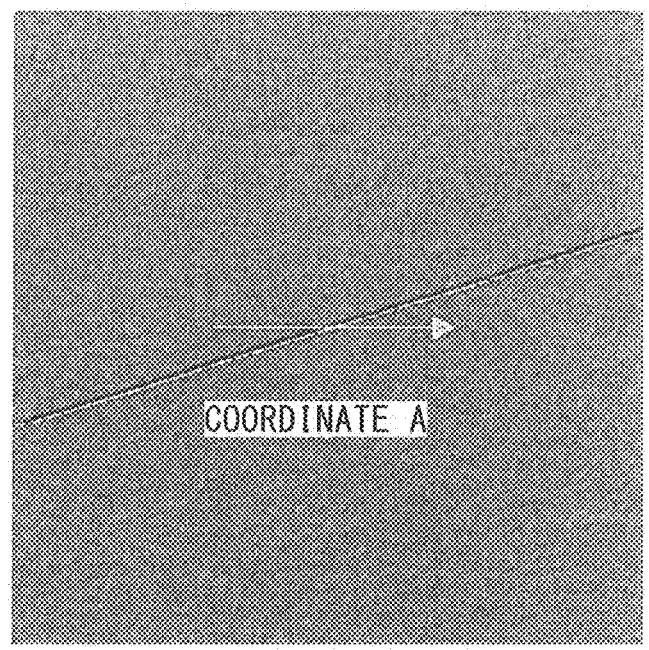
FIG. 5 shows an image obtained by picking up an image of the surface of the SiC substrate under a confocal differential interference contrast microscopic with an image pickup device such as an image sensor after the CMP treatment.
Figure 6:
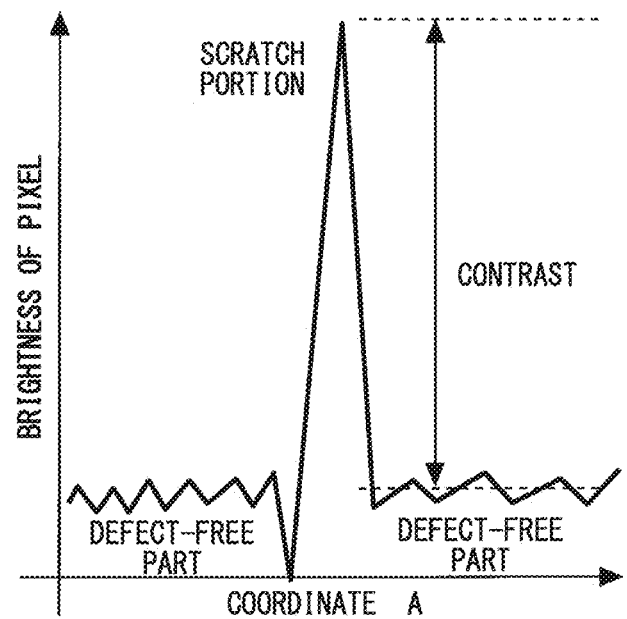
FIG. 6 is a diagram showing the brightness of pixels along a coordinate A of the image in FIG. 5.

FIG. 5 shows an image obtained by picking up an image of the surface of the SiC substrate under a confocal differential interference contrast microscopic with an image pickup device such as an image sensor after the CMP treatment. FIG. 6 is a diagram showing the brightness of pixels along a coordinate A of the image in FIG. 5. The brightness of the pixels is higher at a scratch portion than that at a portion having no defect. Contrast is obtained by quantizing the difference in brightness between the pixels at both the portions.

Figure 7:
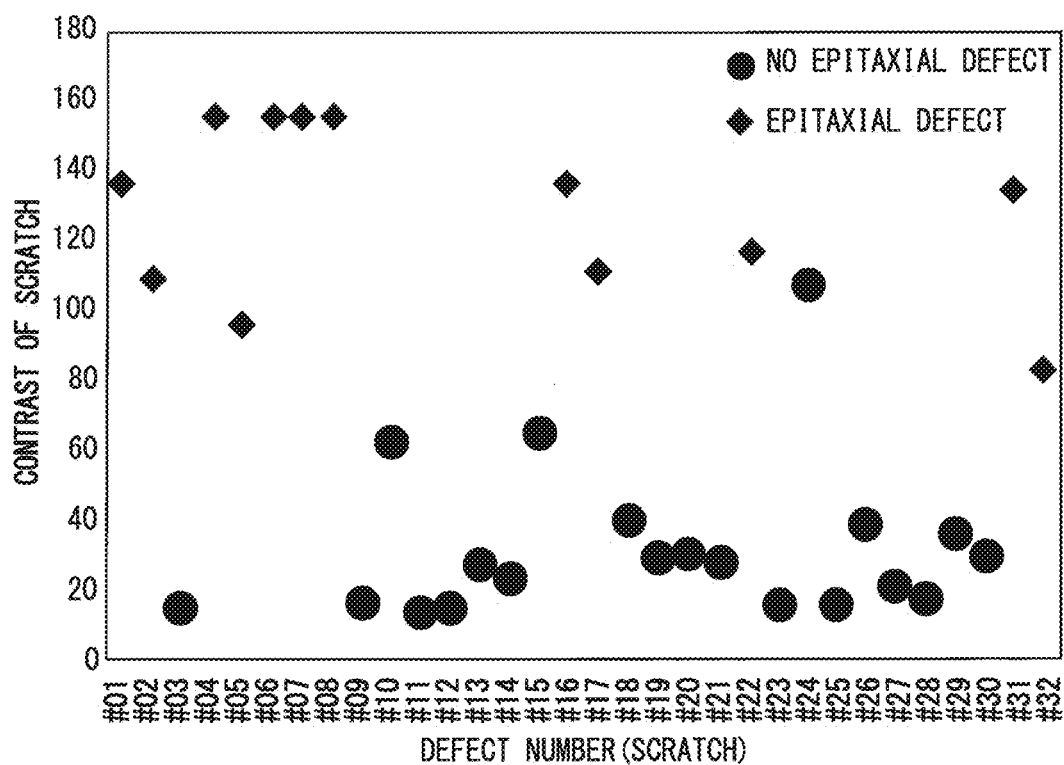
FIG. 7 is a diagram showing a detection result of scratches on the surface of the SiC substrate after the CMP treatment.

FIG. 7 is a diagram showing a detection result of scratches on the surface of the SiC substrate after the CMP treatment. An SiC substrate defect inspecting/reviewing apparatus SICA88 or SICA6X of Lasertec Company was used as the detector 2. A contrast value of a defect image detected as a scratch, and also whether the scratch serves as a starting point of an epitaxial defect when epitaxial growth has been performed were investigated. In FIG. 7, ● represents a harmful scratch serving as a starting point of an epitaxial defect, and ◆ represents a harmless scratch which did not serve as a starting point of an epitaxial defect.

It has been found based on the investigation using SICA that a scratch having a contrast value of about 70 or more serves as a starting point of an epitaxial defect. As described above, scratches having contrast values equal to or larger than a threshold value out of the detected scratches serve as starting points of an epitaxial defects such as triangular defects or carrot defects. The triangular defect is a heterogeneous polytype lamination defect. However, since it is considered that the threshold value changes depending on an etching condition before epitaxial growth, the threshold value of the contrast value may be set for each epitaxial condition.

The influence on the yield of SiC devices by epitaxial defects derived from scratches greatly depends on the chip sizes of the devices. In the case of a large chip size, the device yield decreases greatly even when the number of defects is small. Conversely, in the case of a small chip size, the influence on devices is small even when the number of defects is large. In general, the defective rate to defect density is represented by $100-F [\%]=\exp(-DD \times S)$ where the defect density is represented by DD and the chip area is represented by S. However, since the unit of the scratch is "length", it is impossible to express the defective rate by "defect density".

Therefore, it is determined based on the above-described scratch test result whether the SiC substrate is good or not as described below (step S4). Here, the diameter of the SiC substrate 1 is represented by D, the length of the long side of a device chip to be formed on the SiC substrate 1 is represented by A, the length of the short side of the device chip is represented by B, and an allowable defective rate caused by scratches is represented by F [%]. In this case, the area of the SiC substrate 1 is represented by $\pi(D/2)^2$. By dividing this value by the chip area A×B of the device, an approximate value of the total number of chips per substrate is calculated. When the total number of chips is multiplied by an allowable defective rate F/100, an allowable number of defective chips N is obtained. When a scratch traverses the short side of the device, the number of defective devices caused by the scratch becomes maximum, and thus N×B is an allowable scratch length. Accordingly, when the length L of a scratch having a contrast value equal to or larger than the threshold value is not more than $\pi(D/2)^2/A \times F/100$, the SiC substrate 1 is determined as a good article. The SiC substrate 1 determined as a good article has a scratch-caused defective rate of F [%] or less.

Next, the surface of the SiC substrate 1 determined as a good article is etched with reducing gas such as hydrogen in an epi-reactor (step S5). As a result, a processing-damaged layer on the surface of the SiC substrate 1 is removed, and adhered foreign substances are removed by sublimation. Next, as shown in FIG. 4, growth gas such as silane and propane is introduced into the epi-reactor to epitaxially grow an SiC film 3 on the SiC substrate 1 (step S6). Thereafter, a device such as a transistor is formed in the SiC film 3.

As described above, the inventor has found that a scratch having a high contrast value in the image of the surface of the SiC substrate serves as a starting point of an epitaxial defect. Therefore, extraction of scratches having high contrast values makes it possible to extract only, harmful scratches serving as starting points of epitaxial defects. Accordingly, it is possible to prevent to determine SiC substrates having no problem as defective articles and thus prevent the yield from being reduced. Furthermore, device failure can be prevented by providing a maximum standard of the lengths of harmful scratches.

Incidentally, in the foregoing formula for determining good articles with respect to SiC substrates, D may be set to D-2E in consideration of the width E of a peripheral exclusion region where no device can be formed on the outer periphery of the substrate. For example, when the diameter of the SiC substrate is set to 100 mm, the width of the peripheral exclusion region is set to 3 mm, the length of the long side of the device chip is set to 10 min, and the defective rate is set to 5%, the allowable scratch length L is equal to $\pi((100-2\times3)/2)^2/10\times5/100=34.7$ mm.

Figure 8:
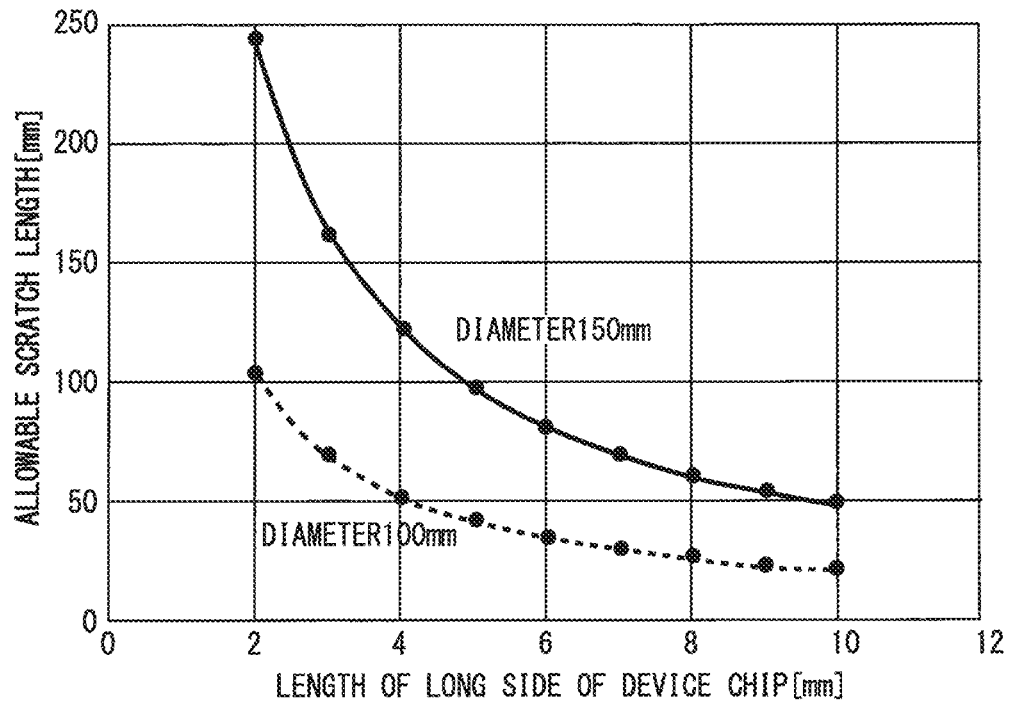
FIG. 8 is a diagram showing allowable scratch lengths for the length of the long side of the device chip.

FIG. 8 is a diagram showing allowable scratch lengths for the length of the long side of the device chip. A solid line represents a ease of a 6-inch SiC substrate with a diameter of 150 mm Φ, and a broken line represents a case of a 4-inch SiC substrate with a diameter of 100 mm Φ. The width of the peripheral exclusion region E is set to 3 mm, and the allowable defective rate F is set to 3%. It is apparent that the allowable scratch length becomes longer as the length of the long side of the device chip is shorter. For example, in the case of a wafer having a diameter of 100 mm, the allowable scratch length is not more than 110 mm then the long side A of the device chip has a length of 2 mm, and the allowable scratch length is not more than 21 mm when the long side of the device chip has a length of 10 mm. In the case of a wafer having a diameter of 150 mm, the allowable scratch length is not more than 250 mm when the long side of the device chip has a length of 2 mm, and the allowable scratch length is not more than 50 mm when the long side of the device chip has a length of 10 mm.

Second Embodiment

Figure 9:
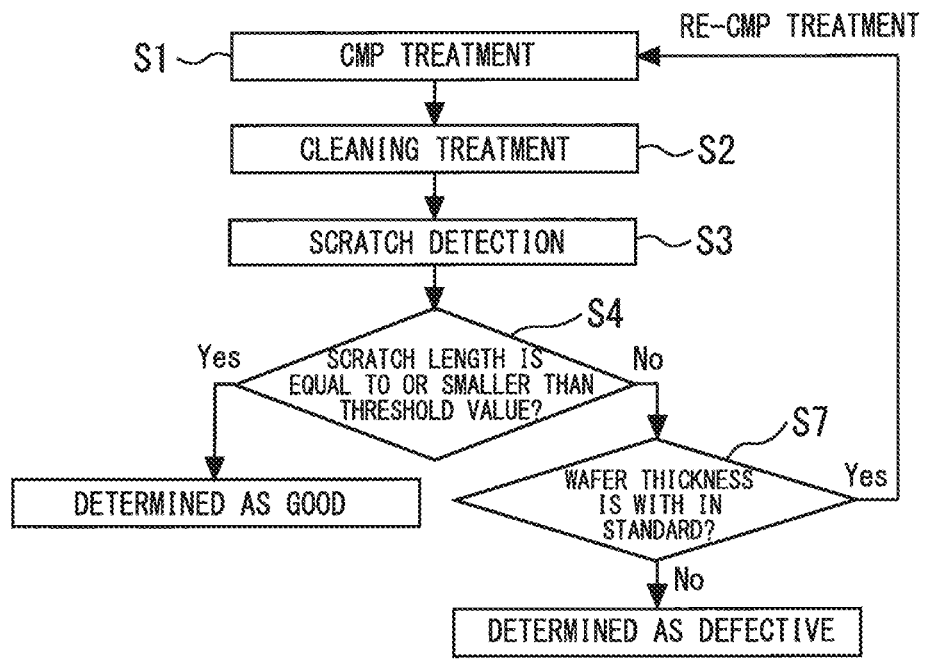
FIG. 9 is a flowchart showing an SiC substrate manufacturing method according to a second embodiment.

FIG. 9 is a flowchart showing an SiC substrate manufacturing method according to a second embodiment. In the present embodiment, when the length of a harmful scratch exceeds the maximum standard, a re-CMP treatment is performed on the SiC substrate 1. The CMP treatment, the scratch detection, etc. are repeated until the SiC substrate 1 is determined as a good article. However, since a thickness of a conveyable substrate is settled in an SiC device manufacturing line, the substrate thickness is measured before the re-CMP treatment is performed, and a substrate thinner than the standard is determined as a defective article (step S7).

The depths of scratches remaining after the CMP treatment are as small as approximately 10 nm. Accordingly, the re-CMP treatment does not require the same polishing amount as the initial CMP treatment, and the re-CMP treatment is performed under such a condition that scratches are unlikely to occur, for example by reducing the polishing rate.

Figure 10:
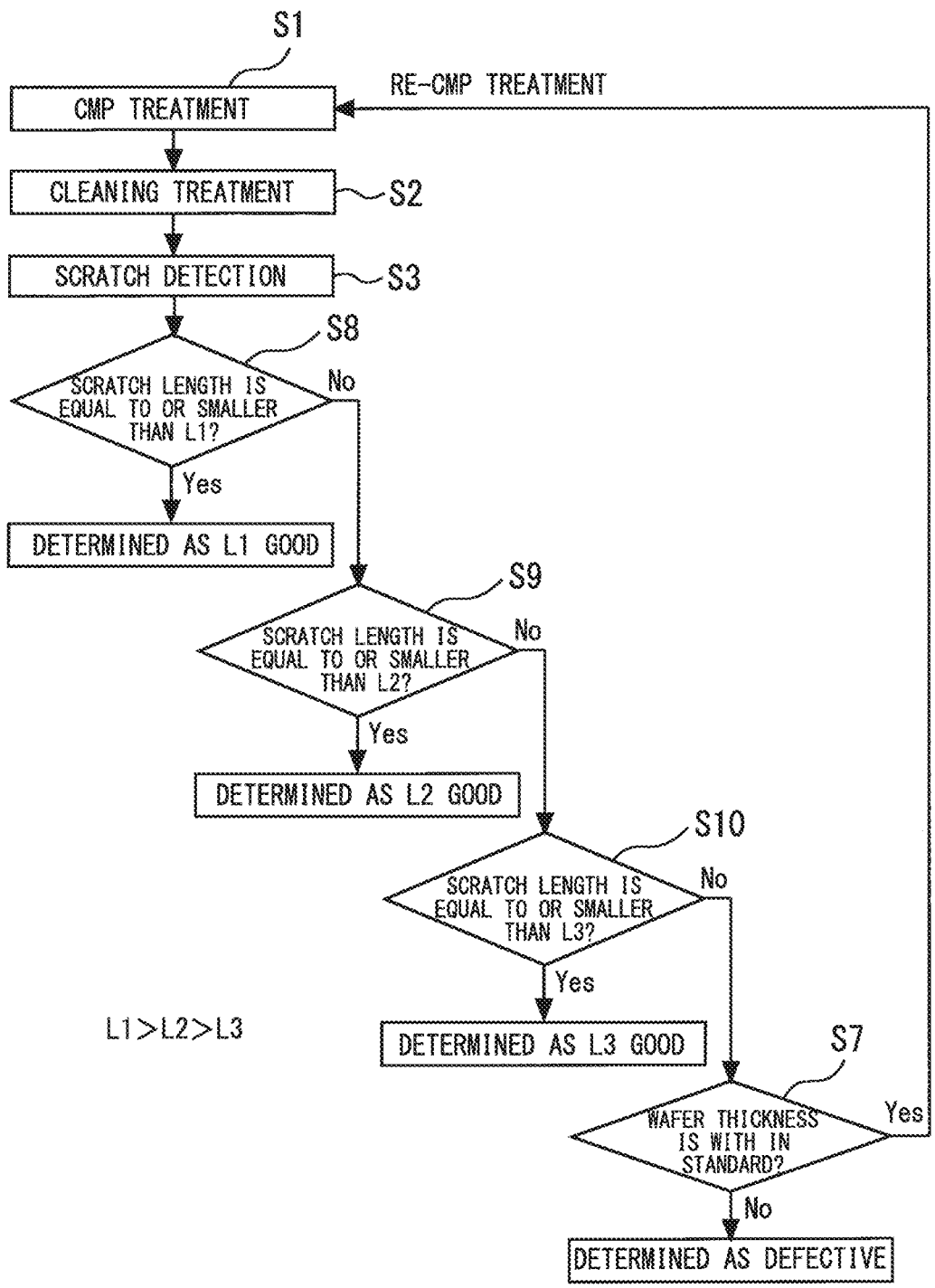
FIG. 10 is a flowchart showing a modification of the SiC substrate manufacturing method according to the second embodiment.

FIG. 10 is a flowchart showing a modification of the SiC substrate manufacturing method according to the second embodiment. Consider a case where three types of devices whose long side lengths are A1, A2 and A3 are formed. However, A1>A2>A3 is satisfied. The defective rate caused by scratches depends on the length of the long side of the device chip, and the allowable scratch length is longer as the length of the long side is shorter. The magnitude relation of scratch lengths L1, L2, and L3 which are allowable to the respective devices is represented by L1<L2<L3.

Therefore, when the length of a scratch having a high contrast value is not more than L1, the SiC substrate is determined as an L1 good article (step S8). The L1 good article can be applied to devices having long side lengths A1 to A3. When the length of the scratch is not more than L2, the SiC substrate is determined as an L2 good article (step S9). The L2 good article can be applied to devices having long side lengths A2 and A3. When the length of a scratch is not more than L3, the SiC substrate is determined as an L3 good article (step S10). The L3 good article can be applied to a device having the long side length A3. As described above, SiC substrates are selected according to the scratch length with respect to application to each of devices having different chip sizes. The epitaxial film thickness and the carrier concentration are different among SiC devices according to device applications such as a withstand voltage class, so that the applications cannot be apportioned after the epitaxial growth. Therefore, it is important to select SiC substrates before the epitaxial growth.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-097208, filed on May 21, 2018 including specification, claims, drawings and summary, on which the Convention priority of the present application is based, is incorporated herein by reference in its entirety.

The invention claimed is:

1. A method for manufacturing an SiC substrate comprising:
    performing a CMP treatment on an SiC substrate;
    after the CMP treatment, capturing an image of a surface of the SiC substrate to detect a scratch;
    determining the SiC substrate as a good article when a length L of the scratch having a contrast value equal to or larger than a threshold value is not more than $\pi(D/2)^2/A \times F/100$,
    wherein the scratch having the contrast value equal to or larger than the threshold value in the image serves as a starting point of an epitaxial defect,
    a diameter of the SiC substrate is represented by D,
    a length of a long side of a device chip to be formed on the SiC substrate is represented by A, and
    an allowable defective rate caused by scratches is represented by F.

2. The method for manufacturing an SiC substrate according to claim 1, wherein the CMP treatment and the scratch detection are repeated until the SiC substrate is determined as a good article.

3. The method for manufacturing an SiC substrate according to claim 1, further comprising epitaxially growing an SiC film on the SiC substrate determined as a good article.

4. The method for manufacturing an SiC substrate according to claim 2, further comprising epitaxially growing an SiC film on the SiC substrate determined as a good article.

* * * * *